US010634699B2

(12) United States Patent
Krause et al.

(10) Patent No.: US 10,634,699 B2
(45) Date of Patent: Apr. 28, 2020

(54) DEVICE FOR REMOVING A TEST CONTACT OF A TEST CONTACT ARRANGEMENT

(71) Applicant: PAC TECH—PACKAGING TECHNOLOGIES GMBH, Nauen (DE)

(72) Inventors: Thorsten Krause, Velten (DE); Ghassem Azdasht, Berlin (DE)

(73) Assignee: PAC TECH—PACKAGING TECHNOLOGIES GMBH, Nauen (DE)

( * ) Notice: Subject to any disclaimer, the term of this patent is extended or adjusted under 35 U.S.C. 154(b) by 89 days.

(21) Appl. No.: 15/753,723

(22) PCT Filed: Jul. 26, 2016

(86) PCT No.: PCT/EP2016/067761
§ 371 (c)(1),
(2) Date: Feb. 20, 2018

(87) PCT Pub. No.: WO2017/032532
PCT Pub. Date: Mar. 2, 2017

(65) Prior Publication Data
US 2018/0259554 A1 Sep. 13, 2018

(30) Foreign Application Priority Data
Aug. 26, 2015 (DE) .......................... 10 2015 114 129

(51) Int. Cl.
G01R 31/20 (2006.01)
G01R 1/067 (2006.01)
(Continued)

(52) U.S. Cl.
CPC ..... *G01R 1/06733* (2013.01); *G01R 1/06705* (2013.01); *G01R 3/00* (2013.01); *G01R 1/073* (2013.01)

(58) Field of Classification Search
CPC ..... H01L 2924/12042; H01L 2924/014; H01L 24/16; H01L 2224/0401;
(Continued)

(56) References Cited
U.S. PATENT DOCUMENTS 4,534,811 A * 8/1985 Ainslie ................ B23K 20/023
156/272.8
4,970,365 A * 11/1990 Chalco ................ B23K 1/0056
219/121.63
(Continued)

FOREIGN PATENT DOCUMENTS

CN 101019475 A 8/2007
DE 10 2008 051853 A1 4/2010
(Continued)

OTHER PUBLICATIONS

The International Search Report and Written Opinion as dated Oct. 7, 2016, for International Application No. PCT/EP2016/067761.
(Continued)

Primary Examiner — Vinh P Nguyen
(74) Attorney, Agent, or Firm — Quarles & Brady LLP

(57) ABSTRACT

A device for the placing and contacting of a test contact of a test contact arrangement arranged on a contact carrier featuring a contact head having at least one transmission channel for transmitting thermal energy and transferring a vacuum. The contact head is provided with a test contact receptacle at its contact end in the area of a channel mouth, the test contact receptacle having a receiving gap formed between two parallel receiving cheeks for receiving the test contact and connected with the transmission channel. The
(Continued)

receiving cheeks have contact surfaces at their contact ends for contacting a solder deposit arranged on the contact carrier to produce a heat conducting contact with the solder material of the solder deposit.

8 Claims, 3 Drawing Sheets

(51) Int. Cl.
*G01R 3/00* (2006.01)
*G01R 1/073* (2006.01)

(58) Field of Classification Search
CPC ........... H01L 2224/81224; H01L 24/81; H01L 25/0657; H01L 2224/11003; H01L 2224/81193; H01L 24/06; H01L 2224/73204; H01L 2224/81192; H01L 2224/81815; H01L 24/32; H01L 21/67144; H01L 2224/04105; H01L 2224/12105; H01L 2224/16; H01L 2224/16145; H01L 2224/16221; H01L 2224/24137; H01L 2224/2518; H01L 2224/73253; H05K 2203/041; H05K 3/3478; H05K 2203/107; H05K 2203/082; H05K 2203/0195; H05K 3/3494; H05K 2201/0112; H05K 2201/10681; H05K 3/328; H05K 2201/0305; H05K 2201/0382; H05K 2203/0278; H05K 3/303; H05K 2203/043; H05K 2203/0557; G01R 1/06733; G01R 1/06705; G01R 1/073; G01R 3/00; G01R 1/06727; G01R 1/07342; H01R 43/0221; H01R 43/02; H01S 5/02272; H01S 5/02276

See application file for complete search history.

(56) References Cited

U.S. PATENT DOCUMENTS

| | | | |
|---|---|---|---|
| 5,938,951 A | 8/1999 | Azdasht | |
| 6,713,714 B1 | 3/2004 | Azdasht | |
| 8,480,298 B2 * | 7/2013 | Azdasht | G01R 1/06705 374/141 |
| 2002/0060580 A1 | 5/2002 | Yamabe | |
| 2004/0060971 A1 | 4/2004 | Azdasht | |
| 2005/0247755 A1 | 11/2005 | Laurent et al. | |
| 2008/0108255 A1 | 5/2008 | Peloza et al. | |
| 2009/0249620 A1 | 10/2009 | Azdasht | |
| 2011/0235681 A1 | 9/2011 | Azdasht | |
| 2015/0364446 A1 | 12/2015 | Azdasht | |

FOREIGN PATENT DOCUMENTS

| | | |
|---|---|---|
| JP | 2010004017 A | 1/2010 |
| TW | 201438120 A | 10/2014 |

OTHER PUBLICATIONS

Taiwan Intellectual Property Office, Office Action and Search Report, Application No. 105126292, dated May 16, 2019, 6 pages.
PCT English Language Translation of the International Preliminary Report on Patentability, PCT/EP2016/067761, dated Mar. 8, 2018, 6 pages.
China National Intellectual Property Administration, First Office Action and Search Report, Application No. 201680048470.2, dated Dec. 3, 2019, 15 pages.
Japan Patent Office, Notice of Grounds of Rejection, Application No. 2018-509801, dated Aug. 6, 2019, 6 pages.

* cited by examiner

DEVICE FOR REMOVING A TEST CONTACT OF A TEST CONTACT ARRANGEMENT

CROSS-REFERENCE TO RELATED APPLICATIONS

This application represents the national stage entry of PCT International Application No. PCT/EP2016/067761 filed on Jul. 26, 2016, which claims the benefit of German Patent Application No. 10 2015 114 129.9 filed on Aug. 26, 2015, the entire contents of which are incorporated herein by reference for all purposes.

The invention relates to a device for the placing and contacting of a test contact of a test contact arrangement arranged on a contact carrier, wherein the device features a contact head having at least one transmission channel for transmitting thermal energy and transferring a vacuum, wherein the contact head is provided with a test contact receptacle at its contact end in the area of a channel mouth.

A device for the placing and contacting of test contacts on a contact carrier is known from DE 10 2008 051 853 A1, said device serving for the production of a test contact arrangement on the contact carrier. In order to produce the test contact arrangement, individual test contacts are arranged on the contact carrier one after the other in a row arrangement with small spacing. Immediately after the placing of the individual test contact with a contact edge on a terminal contact of the contact carrier provided with a solder deposit, an application of thermal energy to the test contact is effected for producing a solder connection between the test contact and the solder deposit.

The device known from DE 10 2008 051 853 A1 comprises a contact head which at its contact end comprises a test contact receptacle with a test contact lay-on surface for positioning the test contact. In the known device, the input of the thermal energy required for fusing a solder deposit arranged on the contact carrier is effected by means of a direct application of laser energy to the test contact. To this end, a surface of the test contact exposed in the area of a channel mouth is used as an absorption surface. Therefore it is suggested in DE 10 2008 051 853 A1 to arrange the test contact under an angle of inclination in relation to the channel axis of the transmission channel in order to obtain as large an absorption surface as possible, thus enabling a sufficient input of thermal energy for a secure contacting.

Due to a corresponding inclined position of the test contact receptacle in relation to the channel axis of the contact head, the known contact head is designed exclusively for a sequential placing and contacting, i.e. a continuous progressing in one direction, of the test contacts on the contact carrier. A separate contacting of a test contact in a random sequence is not intended with the known contact head.

When the test contact arrangement is in operation, or during the production of the test contact arrangement as well, damage to or incorrect contacting of the test contacts may occur, which will make the exchange of individual test contacts at any location in the test contact arrangement necessary.

The object of the invention therefore is to propose a device mentioned at the beginning, which enables a separate contacting of a test contact at any location in a test contact arrangement ensuring sufficient thermal energy input for a secure contacting.

To attain this object, the inventive device exhibits the features of claim 1.

According to the invention, the device comprises a test contact receptacle having a receiving gap formed between two parallel receiving cheeks for receiving the test contact and connected with the transmission channel, wherein the receiving cheeks have contact surfaces at their contact ends for producing a heat conducting contact with a solder deposit arranged on the contact carrier.

Due to the embodiment of the test contact receptacle having a receiving gap formed between two parallel receiving cheeks and comprising receiving cheeks having contact surfaces at their contact ends for producing a heat conducting contact with the solder deposit, it is possible on the one hand to take the test contact, which is to be placed separately on the contact carrier, in a defined position and secured in said position by an application of vacuum, to the connection point on the contact carrier, and to introduce into the solder deposit the thermal energy required for fusing the solder material by means of the same receiving cheeks which secure the test contact in its position, wherein an application of thermal energy to the receiving cheeks in the area of the channel mouth is sufficient for this purpose.

Furthermore, the embodiment of the test contact receptacle with two parallel receiving cheeks enables a design of the test contact receptacle with as narrow a width as possible, which enables the insertion of the test contact receptacle into a clearance caused by a test contact flaw between neighboring test contacts.

Even though the inventive device is primarily intended for placing and subsequently contacting an individual test contact between neighboring test contacts at existing test contact flaws between neighboring test contacts of a test contact arrangement in order to repair the flaw, it is generally possible to use the inventive device for the removal of a test contact, i.e. for producing a flaw between two neighboring test contacts. Thus a removal of a damaged test contact, for example, can be carried out by placing the test contact receptacle on the contact carrier in such a way that the receiving gap is guided over the test contact, and the contact ends of the receiving cheeks are contacted with their contact surfaces against the solder deposit on the contact carrier, and a fusing of the solder deposit is effected by means of an application of thermal energy to the solder deposit via the receiving cheeks. After the fusing of the solder deposit, a flaw in the test contact arrangement can be produced by an application of a vacuum to the test contact and a simultaneous removal of the contact head from the contact carrier, and said test contact arrangement can subsequently be re-equipped with a new test contact by means of the same contact head after the replacing of the test contact arranged in the receiving gap with a new test contact, wherein a renewed fusing of the solder deposit via the receiving cheeks is effected in order to produce a solder connection between the new test contact and the solder deposit on the contact carrier.

In a particularly preferred embodiment of the device, the transmission channel, in the channel mouth in the transition to an opening rim of the receiving gap, comprises an absorption surface in a channel wall, said absorption surface having a larger angle of inclination in relation to a channel axis than a wall section of the channel wall adjacent to the absorption surface, so as to relatively enlarge the surface projection essential to the heat input vertically to the channel axis adjacent to the opening rim of the receiving gap and to thus improve the thermal input.

Preferably, the absorption surface is formed by a step in the channel wall, wherein it is especially preferred if the absorption surface is formed by a parabolic surface, so that in the case of an application of radiation energy to the absorption surface a radiation concentration is additionally achieved in the area of the absorption surface.

If the receiving cheeks are composed of a material different from the material used for the channel walls, a material with a particularly high thermal capacity can be chosen for the receiving cheeks, for example, and a material with a particularly low thermal capacity can be chosen for the channel wall, so as to enable as good a transmission of heat to the solder deposit as possible on the one hand, and to minimize an undesirable dissipation of thermal energy via the channel wall on the other hand.

In order to optimize the thermal transmission between the contact surfaces of the receiving cheeks and the solder deposit arranged on the contact carrier, it is advantageous if the contact surfaces exhibit a surface profile which can be adjusted to the topography of the solder deposit.

If the receiving cheeks are arranged on the test contact receptacle so as to be exchangeable, the most suitable material for the receiving cheeks in terms of the composition of the solder material of the solder deposit can be chosen depending on the application case.

It is especially advantageous if, besides having a connecting device for connection to a laser device and a connecting device for connection to a vacuum source, the device features an infrared sensor device having an infrared sensor for detecting infrared radiation reflected by the receiving cheeks and having a control device for controlling the laser device subject to a sensor signal of the infrared sensor.

Therefore, the sensor signal can be used, for example, to limit a temperature load on the receiving cheeks in such a way that the laser device is deactivated once a defined temperature in the receiving cheeks has been reached.

In the following, a preferred embodiment of the invention is explained in reference to the drawings.

In the figures

Figure 1:
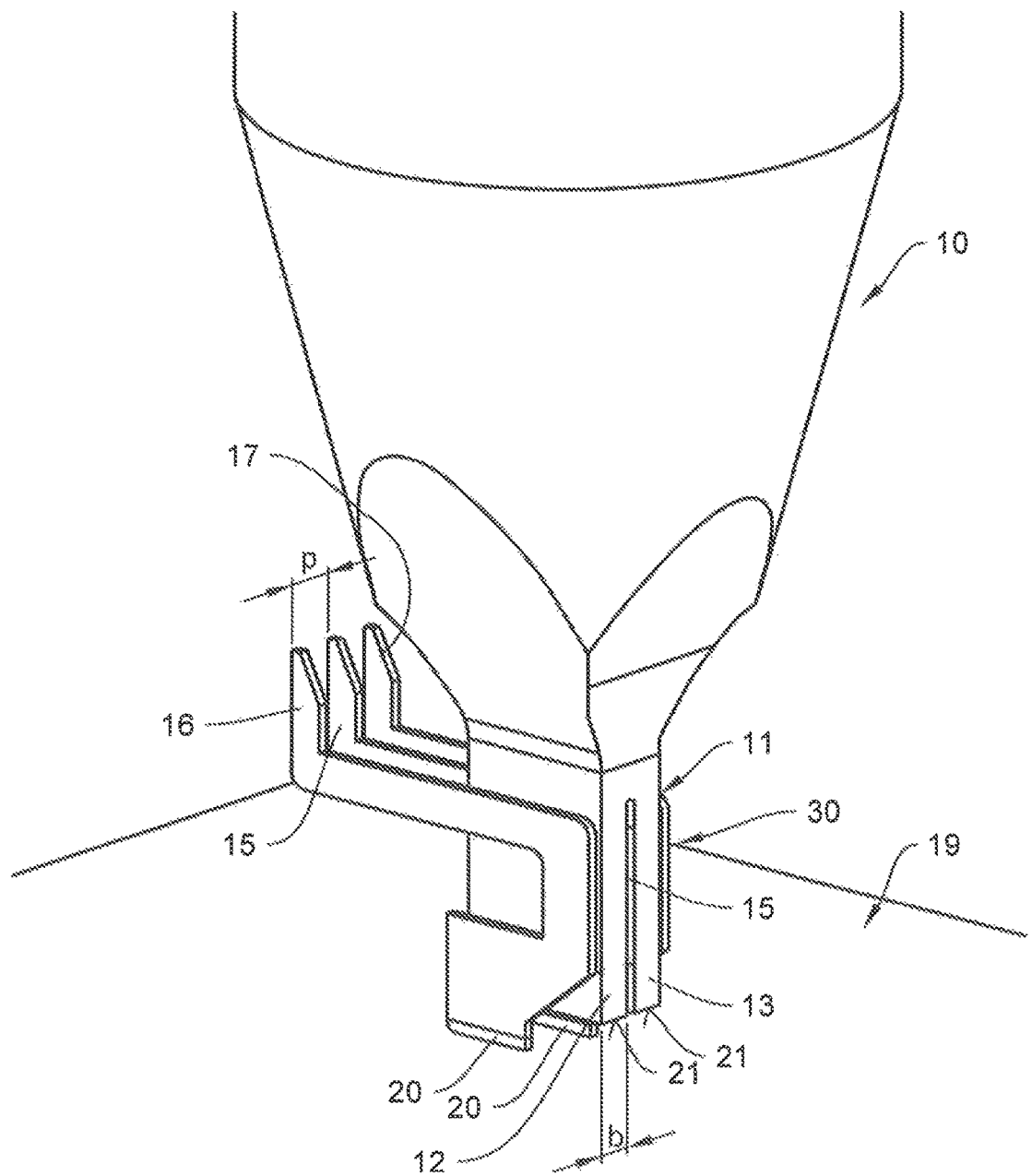
FIG. 1 shows a contact head of the device with a test contact received in the test contact receptacle during a contacting process.

FIG. 1 shows a contact head 10 having a test contact receptacle 11, which receives a test contact 15 in a receiving gap 14 formed between two parallel receiving cheeks 12, 13 during a contacting process.

In the application case illustrated in FIG. 1, the test contact 15 is placed in a flaw of a test contact arrangement 30 between test contacts 16, 17 adjacent to the flaw. Thereby a parallel alignment of the test contact 15 to the neighboring test contacts 16, 17 is carried out via the contact head 10, wherein the test contact 15 is positioned with a contact edge 18 on a solder deposit 20 arranged on a contact carrier 19, and subsequently a fusing of the solder deposit 20 is carried out via a physical contact formed between the contact surfaces 21 of the receiving cheeks 12, 13 and the solder deposit 20.

Figure 2:
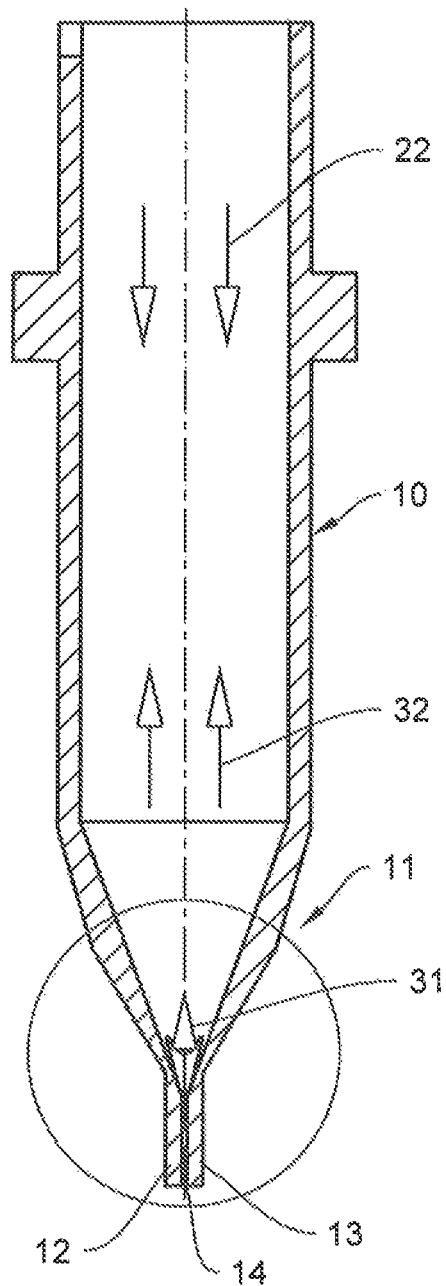
FIG. 2 shows a longitudinal sectional view of the contact head.
Figure 3:
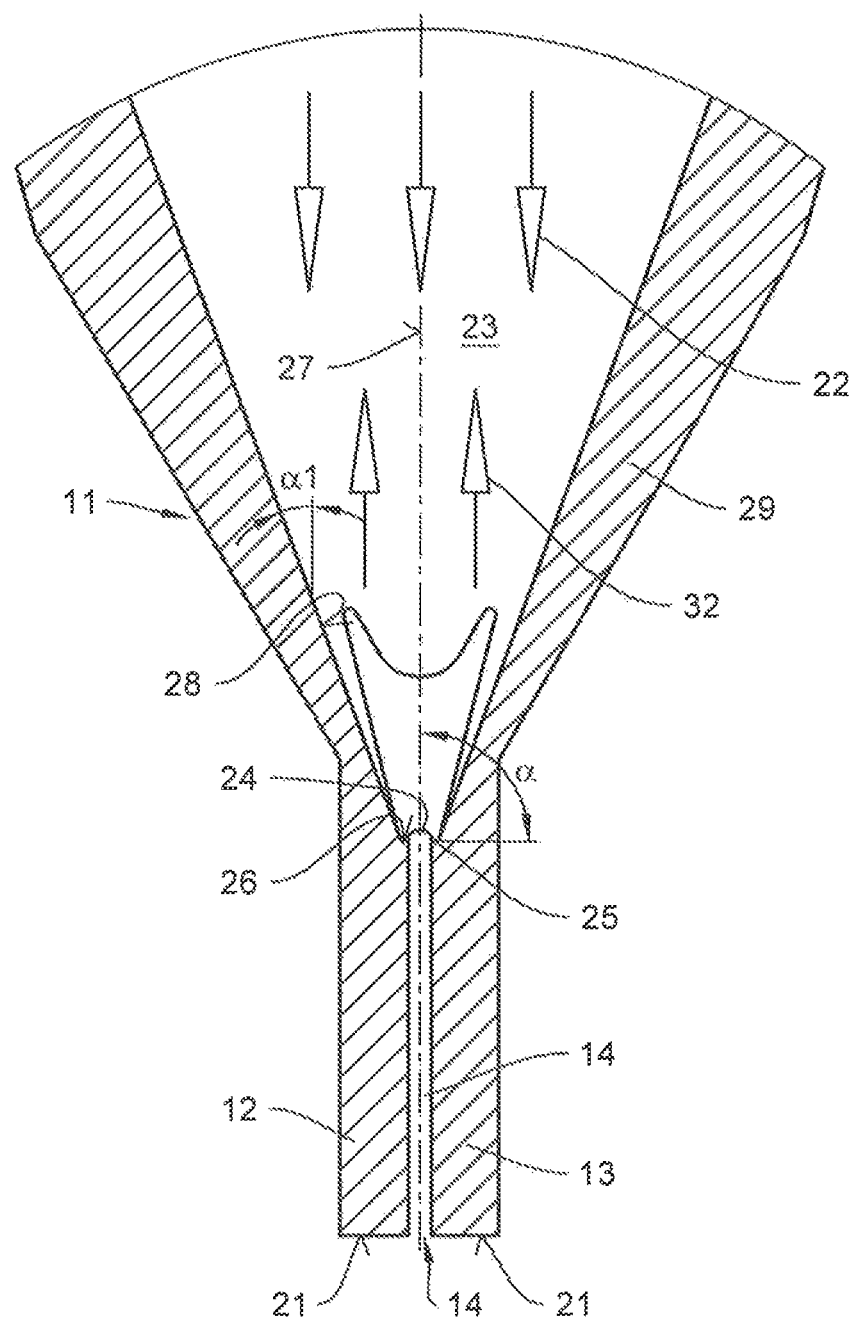
FIG. 3 shows an enlarged view of a test contact receptacle of the contact head.

As shown in FIGS. 2 and 3, an application of laser energy 22 to the receiving cheeks 12, 13 is carried out in order to introduce the thermal energy required for fusing the solder material deposit 20, said laser energy 22 being introduced into the receiving cheeks 12, 13 as laser radiation via a transmission channel 23 formed in the contact head 10.

As FIG. 3 in particular shows, an absorption surface 26 is formed in a channel mouth 24 in the transition to an opening rim 25 of the receiving gap 14, said absorption surface 26 being formed as a step in the present case.

Thereby, the absorption surface 26 features an angle of inclination $\alpha=90°$ in relation to the channel axis 27, the angle of inclination being larger than an angle of inclination $\alpha 1=45°$ with which a wall section 28 of a channel wall 29 adjacent to the absorption surface 26 is inclined in relation to the channel axis 27.

As shown in FIG. 1, the receiving cheeks 12, 13 are dimensioned in their width b in such a way that the width of a receiving cheek 12, 13 is smaller than a pitch p formed regularly between the test contacts 15, 16, 17 of the test contact arrangement 30.

As illustrated by the arrows used as direction indicators in FIG. 2, the transmission channel 23 not only serves for the application of laser energy 22 to the receiving cheeks 12, 13 but also for the application of a vacuum 31 to the receiving gap formed between the receiving cheeks 12, 13 as well as for transferring an infrared reflection radiation 32 transmitted by the receiving cheeks 12, 13 to a sensor device not illustrated here, said infrared reflection radiation 32 serving as an input variable for a control device, also not illustrated here, for controlling a laser device emitting the laser energy 22 via a corresponding sensor output signal of an infrared sensor of the sensor device.

The invention claimed is:

1. A device for the placing and contacting of a test contact of a test contact arrangement arranged on a contact carrier, wherein the device comprises:
   a contact head having at least one transmission channel for transmitting thermal energy and transferring a vacuum; and
   a test contact receptacle provided at a contact end of the contact head in the area of a channel mouth, wherein the test contact receptacle has a receiving gap for receiving the test contact, the receiving gap formed between two parallel receiving cheeks and connected with the transmission channel, the receiving cheeks having contact surfaces at their contact ends for contacting a solder deposit arranged on the contact carrier to produce a heat conducting contact with the solder material of the solder deposit.

2. The device according to claim 1, wherein the transmission channel comprises an absorption surface in a channel wall in the channel mouth in the transition to an opening rim of the receiving gap, said absorption surface having a larger angle of inclination $\alpha$ in relation to a channel axis than a wall section of the channel wall adjacent to the absorption surface.

3. The device according to claim 2, wherein the absorption surface is formed as a step in the channel wall.

4. The device according to claim 2, wherein the absorption surface is formed as a parabolic surface.

5. The device according to claim 1, wherein the receiving cheeks are composed of a material different from the material of the channel wall.

6. The device according to claim 1, wherein the contact surfaces of the receiving cheeks exhibit a surface profile.

7. The device according to claim 1, wherein the receiving cheeks are arranged on the test contact receptacle so as to be exchangeable.

8. The device according to claim 1, comprising:
   a connecting device for connection to a laser device,
   a connection device for connection to a vacuum source; and an infrared sensor device, the infrared sensor device having an infrared sensor for detecting infrared radiation reflected by the receiving cheeks, and a control device for controlling the laser device subject to the sensor signal of the infrared sensor.

\* \* \* \* \*